United States Patent [19]

Schuster et al.

[11] Patent Number: 4,982,890
[45] Date of Patent: Jan. 8, 1991

[54] SOLDERING MEANS HAVING AT LEAST ONE STIRRUP ELECTRODE AND TWO SOLDERING WEBS LYING OPPOSITE ONE ANOTHER OR FOUR SOLDERING WEBS LYING OPPOSITE ONE ANOTHER IN PAIRS

[75] Inventors: Rudolf Schuster, Heimstetten; Josef Raschke, Gelting; Klaus Kamperdicks, Munich, all of Fed. Rep. of Germany

[73] Assignee: Siemens Aktiengesellschaft, Berlin & Munich, Fed. Rep. of Germany

[21] Appl. No.: 444,831

[22] Filed: Dec. 1, 1989

[30] Foreign Application Priority Data

Jan. 10, 1989 [DE] Fed. Rep. of Germany ....... 3900520

[51] Int. Cl.$^5$ .......................... B23K 3/00; B23K 3/03
[52] U.S. Cl. ..................... 228/44.7; 228/55; 219/85.16; 219/85.18; 219/243
[58] Field of Search ............ 228/180.2, 44.7, 51, 228/55; 219/85.16, 85.18, 228, 243

[56] References Cited

U.S. PATENT DOCUMENTS

| 3,448,911 | 6/1969 | Cushman | 228/44.7 |
| 3,957,185 | 5/1976 | Kauffman et al. | 228/44.7 |
| 4,025,750 | 5/1977 | Keizer et al. | 219/85.18 |
| 4,573,627 | 3/1986 | Miller et al. | 228/180.2 |
| 4,768,702 | 9/1988 | Takahashi et al. | 228/44.7 |
| 4,851,648 | 7/1989 | Jacobs et al. | 228/44.7 |
| 4,875,614 | 10/1989 | Cipolla et al. | 228/44.7 |
| 4,894,506 | 1/1990 | Woerner | 219/85.18 |

FOREIGN PATENT DOCUMENTS

| 0011046 | 5/1980 | European Pat. Off. |
| 2818958 | 11/1978 | Fed. Rep. of Germany . |
| 3149236 | 8/1982 | Fed. Rep. of Germany . |

Primary Examiner—Sam Heinrich
Attorney, Agent, or Firm—Hill, Van Santen, Steadman & Simpson

[57] ABSTRACT

In a soldering device comprising at least one stirrup electrode that is secured to a soldering stirrup holder and is heatable with electrical resistance heating and has two soldering webs lying opposite one another or four soldering webs lying opposite one another in pairs, the working surfaces at the underside of the soldering webs should be capable of being placed exactly parallel onto the soldering location that lies, for example, on a printed circuitboard. This is enabled by a flexible suspension of the soldering stirrup holder which provides a pivot compensation center lying centrally in the plane of the working surfaces. As a result thereof, a reliable contact of the parts to be soldered to one another and to the soldering stirrups is guaranteed.

5 Claims, 1 Drawing Sheet

SOLDERING MEANS HAVING AT LEAST ONE STIRRUP ELECTRODE AND TWO SOLDERING WEBS LYING OPPOSITE ONE ANOTHER OR FOUR SOLDERING WEBS LYING OPPOSITE ONE ANOTHER IN PAIRS

BACKGROUND OF THE INVENTION

1. Field of the Invention:

The present invention is directed to a soldering apparatus having at least one stirrup electrode secured to a solder stirrup holder and heatable with electrical resistance heat and having two solder webs lying opposite one another or four solder webs lying opposite one another in pairs whose work surfaces lie in one plane.

2. Description of the Prior Art

As an example, German application No. 31 49 236 generally discloses such a soldering device. The electrode holder of this known soldering device comprises small columns of conductive material electrically insulated from one another and between whose ends at least two stirrup electrodes are secured in interchangeable fashion. The U-shaped stirrup electrodes that can be heated by electrical resistance heating are manufactured of a planar plate composed of a resistor material such as tantalum or molybdenum and are attached in such a fashion that their work surfaces, lying on the underside of the solder webs, come into contact with the elements to be soldered. Given a plurality of two or four stirrup electrodes, a total of four small columns are required for the electrode holders, these columns being arranged at a respective diagonal of the cross section of the soldering device and being mechanically connected to one another by a plurality of cross-shaped bracings. For the power supply of four stirrup electrodes, two small columns lying on a diagonal are connected to the one pole of a power source, whereby the two other small columns are connected to the other pole of the power source.

German application No. 28 18 958 discloses another soldering device wherein the electrode holder comprises two small columns of conductive material electrically insulated from one another and between whose ends a single stirrup electrode is secured in an interchangeable manner. This stirrup electrode likewise has four soldering webs lying opposite one another in pairs whose working surfaces have the shape of a one-piece rectangular frame, whereby two soldering webs lying opposite one another are interchangeably secured to the allocated, small columns via upwardly-projecting continuations.

European application No. 011 046 discloses a further soldering device wherein a single stirrup electrode secured at an electrode holder has a total of four soldering webs lying opposite one another in pairs, whose working surfaces have the shape of a one-piece, rectangular frame. Here, however, each of the soldering webs has an upwardly projecting continuation allocated thereto which holds the soldering webs and serves as a power lead. Continuations that lie opposite one another thereby lie electrically parallel with one another.

The known soldering apparatus set forth above are particularly utilized for soldering electronic components having a large number of poles such as micropacs, flatpacks and the like to printed circuitboards, whereby the resistance heating of the stirrup electrodes is undertaken by current pulses. A reliable contact between the working surfaces of the stirrup electrodes, the terminal legs of the components and the interconnects or, respectively, terminal pads of the printed circuitboards must thereby be guaranteed both before the soldering process as well as over the entire duration of the soldering process. This requirement, however, cannot always be met in view of potentially-occurring arcings of the printed circuitboards, of tolerances of the printed circuitboards in the direction perpendicular to the plane of the printed circuitboards, of tolerances in layer thickness and of a possible skewed position of the printed circuitboards during the soldering process.

SUMMARY OF THE INVENTION

It is therefore the object of the invention to provide an improved soldering device of the type initially set forth such that adequate contact between the working surfaces of the soldering webs, the terminal legs of the components and the interconnects or, respectively, terminal pads of the printed circuitboards is reliably guaranteed before the soldering process and during the soldering process.

The above object is achieved, according to the present invention, with a flexible suspension of the soldering stirrup holder comprising a pivot and compensation center lying centrally in the plane between the working surfaces.

The invention is based on the perception that a flexible suspension of the soldering stirrup holder enables an optimum parallelism compensation between two or four working surfaces and the printed circuitboard when the rotary or, respectively, pivot motions required for this purpose are undertaken about a dislocated pivot and compensation center that lies centrally in the plane between the working surfaces. Undesired and injurious transmission of forces in the direction of the printed circuitboard plane when the soldering device is placed onto the soldering location only given such a position of the pivot and compensating center. Slight normal forces are at most transmitted onto the printed circuitboard for the parallelism compensation during placement onto the soldering location. The higher pressure required for the soldering process is then exerted only after the parallelism compensation, i.e. exclusively as a normal force.

According to a preferred feature of the invention, the excursions of the soldering stirrup holder around the pivot and compensation center are at least largely free of restoring forces. A force transmission onto the printed circuitboard caused by the parallelism compensation can thereby be practically completely avoided.

According to another feature of the invention, the flexible suspension can be locked for fixing a deflected position of the soldering stirrup holder. With such a locking, for example, the parallelism compensation undertaken for the first soldering can be retained for the following solderings given a skewed position of a printed circuitboard.

Finally, anti-twist means allocated to the flexible suspension has proven extremely advantageous in order to prevent turns around an axis extending perpendicularly relative to the working surfaces. Turnings of the working surfaces in the plane of the printed circuitboard and relative to the soldering location caused by cable leads, by forces of gravity when moving the soldering device or as a result of unintentional collisions can be reliably suppressed with such an anti-twist means. The flexible suspension of the soldering stirrup holder then only has the second degree of freedom with two rotations perpendicular to the plane of the printed circuitboard.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
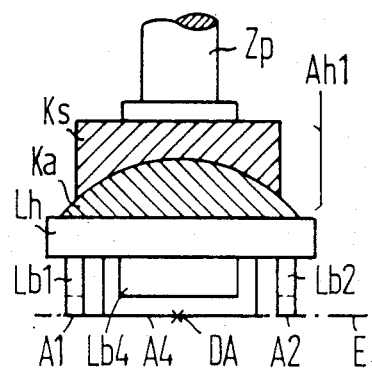
FIG. 1 is a side view showing the highly-simplified basic principle of a soldering device constructed in accordance with the invention and comprising four U-shaped flat soldering stirrups.
Figure 2:
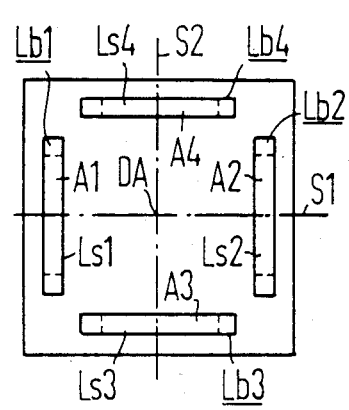
FIG. 2 is a plan view looking onto the working surfaces of the flat soldering stirrup of the soldering device of FIG. 1 and having an exact definition of the precision of the pivot and compensation center.

Referring to FIG. 1, a highly-simplified, schematic illustration of the basic principle of the soldering device of the invention is illustrated in which those parts such as power leads and the like that are not required for an understanding of the invention have been omitted. The illustrated soldering device has four U-shaped flat soldering stirrups Lb1, Lb2, Lb3 and Lb4 secured to a soldering stirrup holder Lh, whereby the appertaining soldering webs are referenced Ls1, Ls2, Ls3 and Ls4, as shown in FIG. 2, and four alloca&:ed working surfaces at the underside of the soldering webs are referenced A1, A2, A3 and A4. It may be particularly seen from FIG. 2 that the soldering webs Ls1 and Ls2 are aligned parallel to and at a distance from one another. The soldering webs Ls3 and Ls4 are likewise aligned parallel to and at a distance from rne another, so that the working surfaces A1, A2, A3 and A4 lying in a plane referenced E form a frame that is square in the illustrated exemplary embodiment and that is not closed a& its corner regions.

By way of a shaft Zp, the soldering stirrup holder Lh is accepted into a conveyor device (not shown on the drawing) that is movable in three directions perpendicular to one another and, accordingly, enables a positioning over the respective soldering location and a lowering onto the respective soldering location. The soldering stirrup holder Lh is connected to the shaft Zp via a flexible suspension Ah1 such that the soldering stirrup holder Lh comprising the flat soldering stirrups Lb1-Lb4 can be moved about a pivot and compensation center that is referenced Da in FIG. 1 and in FIG. 2. This pivot and compensation center Da lies in the Ilane E of the working surfaces A1-A4, lying precisely in the center between these working surfaces A1-A4, whereby the central position is illustrated in FIG. 2 by the two symmetry axes S1 and S2.

The flexible suspension Ah1 that is only schematically shown in FIG. 1 comprises a spherical section Ka connected to the soldering stirrup holder Lh and comprises a spherical shell Ks connected to the shaft Zp, whereby &he centers of the spherical section Ka and the spherical shell Ks lie exactly at the pivot and compensation center Da. The flexible suspension Ah1 should enable pivoting or, respectively, ccmpensating motions around the pivot and compensation center Da that are at least largely free of restoring forces. In the schematic illustration of FIG. 1, for example, one can imagine that ir that the cohesion between the spherical section Ka and the spherical shell Ks is guaranteed by a mutual, magnetic attraction.

Figure 3:
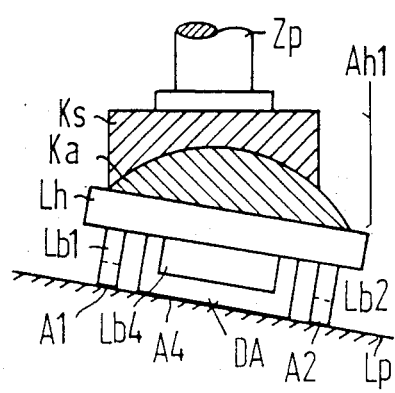
FIG. 3 is a side view similar to that of FIG. 1 showing the parallelism compensation of the soldering device shown in FIGS. 1 and 2 given a skewed positioning of the printed circuitboard.

FIG. 3 illustrates the furctioning of the soldering device shown in FIGS. 1 and 2 when placed onto an obliquely positioned printed circuitboard Lp. The skewed positioning of the printed circuitboard Lp was thereby shown greatly exaggerated in order to illustrate the principle. During placement, the flat soldering stirrup Lbl whose outer lower edge contacts the printed circuitboard Lb first is pivoted in the upward direction around the pivot and compensation center Da until the working surfaces A1-A4 are aligned parallel to the printed circuitboard. It may be seen that the mobility around the pivot compensation center Da enables an optimum contact of the flat soldering stirrups Lb1-Lb4 with the soldering location not only in the illustrated case, but also given arcings of the printed circuitboard, given tolerances of the printed circuitboard perpendicular to the board plane or given tolerances in layer thickness.

Figure 4:
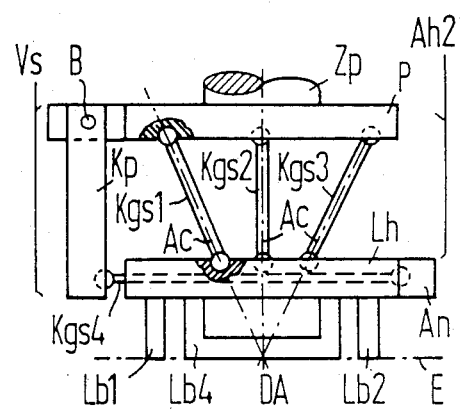
FIG. 4 illustrates a modification of the soldering device shown in FIGS. 1-3 and having an additional anti-twist structure.

FIG. 4 illustrates a modification wherein the soldering stirrup holder Lh is connected to the shaft Zp via a flexible suspension reference Ah2. The flexible suspension Ah2 comprises three ball-jointed rods Kgs1-Kgs3 whose ends are arranged in spherical shells (not referenced in detail) of a plate P or, respectively, of the soldering stirrup holder Lh that is connected to the shaft. The axes Ac of the ball-jointed rods Kgs1-Kgs3 that respectively describe angles of 120° in the projection must thereby be aligned such that their intersection shown in FIG. 4 lies exactly in the pivot and compensation center Da. An anti-twist device referenced Vs prevents rotations of the soldering stirrup holder Lh in the plane E. This anti-twist device comprises a flat strip Kp which is rotatable about a pin B in a fork-shaped recess of the plate P, the lower end of the flat strip Kp being hinged to assigned projections An of the soldering strip holder Lh via two ball-jointed rods Kgs4. In the position shown in FIG. 4, the two ball-jointed rods Kgs4 are arranged parallel to the plane of the drawing in front of and behind the soldering stirrup holder Lh. The illustrated anti-twist device Vs, enables, first of all, the desired compensatory motions about the pivot compensation center Da and, secondly, prevents the undesired rotary motions around an axis perpendicular to the plane E. The latter would prevent an accurate orientation of the flat soldering strips Lb1-Lb4 relative to the terminal configurations of the components to be soldered on. Such an anti-twist device would therefore also be advantageous for the embodiment illustrated in FIGS. 1-3.

In addition to the descrited exemplary embodiments, the invention can also be realized with the assistance of what are referred to as RCC parts (remote certer compliance devices) to which the soldering stirrup holders of traditional soldering devices are secured. Care must thereby be merely exercised to see that the dislocated compensation center of the RCC parts lies exactly in the center of the plane tetween the working surfaces of the soldering device. Existing rotation blocks of these RCC parts can then also be utilized as an anti-twist device.

For example, the described RCC parts are marketed as orientation and joining aids for assembly machines or robots.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a soldering device of the type in which at least one soldering stirrup electrode adapted to be heated by electrical resistance heating is carried by a soldering stirrup holder and comprises a plurality of soldering webs lying opposite one another in pairs and include working surfaces which lie in one plane, the improvement therein comprising:
    a flexible suspension mounting the soldering stirrup holder for movement about a pivot and compensation center which lies centrally in the one plane of the working surfaces.

2. The improved soldering device of claim 1, wherein said flexible suspension comprises *eans for providing excursions of the soldering stirrup holder around the pivot compensation center which are free of restoring forces.

3. The improved soldering device of claim 1, and further comprising:
    anti-twist means for preventing movement about an axis perpendicular to the working surfaces.

4. In a soldering device of the type in which at least one soldering stirrup electrode adapted to be heated by electrical resistance heating is carried by a soldering stirrup holder and comprises a plurality of soldering webs lying opposite one another in pairs and include working surfaces which lie in one plane, the improvement therein comprising:
    a flexible suspension mounting the soldering stirrup holder for movement about a pivot and compensation center which lies centrally in the one plane of the working surfaces, said flexible suspension comprising a spherical shell adapted to be connected to a soldering machine, and a spherical section received in said spherical shell and connected to the soldering stirrup holder.

5. The improved soldering device of claim 4, wherein:
    said spherical shell and said spherical section comprise means for providing a mutual, magnetic attraction.

* * * * *

REEXAMINATION CERTIFICATE (2175th)
United States Patent [19]
Schuster et al.

[11] B1 4,982,890
[45] Certificate Issued  Jan. 4, 1994

[54] SOLDERING MEANS HAVING AT LEAST ONE STIRRUP ELECTRODE AND TWO SOLDERING WEBS LYING OPPOSITE ONE ANOTHER OR FOUR SOLDERING WEBS LYING OPPOSITE ONE ANOTHER IN PAIRS

[75] Inventors: Rudolf Schuster, Heimstetten; Josef Raschke, Gelting; Klaus Kamperdicks, Munich, all of Fed. Rep. of Germany

[73] Assignee: Siemens Aktiengesellschaft, Berlin and Munich, Fed. Rep. of Germany

Reexamination Request:
No. 90/003,045, May 7, 1993

Reexamination Certificate for:
Patent No.: 4,982,890
Issued: Jan. 8, 1991
Appl. No.: 444,831
Filed: Dec. 1, 1989

[30] Foreign Application Priority Data
Jan. 10, 1989 [DE] Fed. Rep. of Germany .... 3900520.8

[51] Int. Cl.$^5$ .......................... B23K 3/00; B23K 3/03
[52] U.S. Cl. .................................. 228/44.7; 228/55; 219/85.16; 219/85.18; 219/243
[58] Field of Search ............... 228/180.2, 44.7, 51, 228/55; 219/85.16, 85.18, 228, 243

[56] References Cited
U.S. PATENT DOCUMENTS
4,768,702 9/1988 Takahashi et al. ............. 228/5.5

OTHER PUBLICATIONS
Schientific American, vol. 238, No. 2, pp. 62–74, Published Feb. 1978, by Nevins et al.

*Primary Examiner*—Samuel M. Heinrich

[57] ABSTRACT

In a soldering device comprising at least one stirrup electrode that is secured to a soldering stirrup holder and is heatable with electrical resistance heating and has two soldering webs lying opposite one another or four soldering webs lying opposite one another in pairs, the working surfaces at the underside of the soldering webs should be capable of being placed exactly parallel onto the soldering location that lies, for example, on a printed circuitboard. This is enabled by a flexible suspension of the soldering stirrup holder which provides a pivot compensation center lying centrally in the plane of the working surfaces. As a result thereof, a reliable contact of the parts to be soldered to one another and to the soldering stirrups is guaranteed.

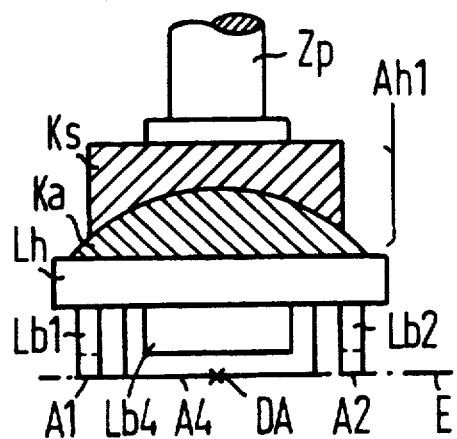

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-5 is confirmed.

* * * * *